United States Patent [19]

Economy et al.

[11] Patent Number: 4,818,812

[45] Date of Patent: Apr. 4, 1989

[54] SEALANT FOR INTEGRATED CIRCUIT MODULES, POLYESTER SUITABLE THEREFOR AND PREPARATION OF POLYESTER

[75] Inventors: James Economy, San Jose, Calif.; John R. Susko, Owego, N.Y.; Willi Volksen, San Jose, Calif.; Robin A. Wheater, Owego, N.Y.

[73] Assignee: International Business Machines Corporation, Armonk, N.Y.

[21] Appl. No.: 525,387

[22] Filed: Aug. 22, 1983

[51] Int. Cl.$^4$ .................................. C08G 63/02
[52] U.S. Cl. .................................. 528/176; 528/191; 528/193; 357/72; 357/74
[58] Field of Search .................. 528/176, 191, 193; 357/72, 74

[56] References Cited

U.S. PATENT DOCUMENTS

| | | | |
|---|---|---|---|
| 3,160,602 | 12/1964 | Kantor et al. | 528/179 |
| 3,160,605 | 12/1964 | Kantor et al. | 528/179 |
| 3,234,167 | 2/1966 | Sweeny | 524/173 |
| 3,374,202 | 3/1968 | Schwarz | 528/176 |
| 3,396,146 | 8/1968 | Schmukler | 525/397 |
| 3,444,131 | 5/1969 | Rosenbrock et al. | 528/176 |
| 3,515,696 | 6/1970 | Tsuji et al. | 260/47 |
| 3,549,593 | 12/1970 | Takekoshi | 260/47 |
| 3,559,002 | 1/1971 | Felock | 317/234 |
| 3,601,667 | 8/1971 | Desmond et al. | 317/234 R |
| 3,637,595 | 1/1972 | Cottis et al. | 260/47 C |
| 3,740,920 | 6/1973 | Lane | 357/74 |
| 3,745,422 | 7/1973 | Carnes | 357/74 |
| 3,773,858 | 11/1973 | Nowak et al. | 528/193 |
| 3,778,410 | 12/1973 | Kuhfuss et al. | 260/47 C |
| 3,804,805 | 4/1974 | Kuhfuss et al. | 260/47 C |
| 3,953,394 | 4/1976 | Fox et al. | 260/40 R |
| 4,064,108 | 12/1977 | Inata et al. | 260/47 C |
| 4,066,620 | 1/1978 | Kleinschuster et al. | 260/47 C |
| 4,107,143 | 8/1978 | Inata et al. | 528/176 |
| 4,118,372 | 10/1978 | Schaefgen | 528/193 |
| 4,146,702 | 3/1979 | Morris et al. | 528/193 |
| 4,159,221 | 6/1979 | Schuessler | 357/74 |
| 4,159,365 | 6/1979 | Payet | 428/364 |
| 4,219,635 | 8/1980 | Cooke et al. | 528/182 |
| 4,233,620 | 11/1980 | Darrow et al. | 357/74 |
| 4,238,599 | 12/1980 | Langley et al. | 528/193 |
| 4,238,600 | 12/1980 | Jackson, Jr. et al. | 528/193 |
| 4,242,496 | 12/1980 | Jackson, Jr. et al. | 528/193 |
| 4,259,458 | 3/1981 | Robeson | 525/68 |
| 4,260,731 | 4/1981 | Mori et al. | 528/173 |

(list continued on next page.)

FOREIGN PATENT DOCUMENTS 2520819 11/1975 Fed. Rep. of Germany.
2751653 5/1978 Fed. Rep. of Germany.

OTHER PUBLICATIONS

Chemical Abstracts, vol. 57, "Plastics", pp. 1961–1962, U.S. Pat. No. 3,036,990 to Kanter et al.; U.S. Pat. No. 3,036,991 to Kantor et al.; U.S. Pat. No. 3,036,992 to Holub, et al.

(List continued on next page.)

Primary Examiner—Maurice J. Welsh
Assistant Examiner—M. L. Moore
Attorney, Agent, or Firm—Pollock, Vande Sande & Priddy

[57] ABSTRACT

Integrated circuit module wherein the cap is sealed to the substrate with a liquid crystalline polyester melt containing about 25 to about 100 mole percent of recurring Units I and O to about 75 mole percent of recurring Units II wherein I 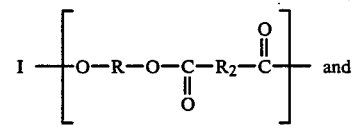 and II is 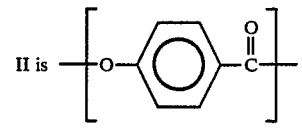

wherein each R and R$_2$ is arylene or cycloalkylene or alkylene or alkylidene.

27 Claims, 1 Drawing Sheet

U.S. PATENT DOCUMENTS

| | | | |
|---|---|---|---|
| 4,265,802 | 5/1981 | Choe | 260/40 P |
| 4,267,303 | 5/1981 | König et al. | 528/171 |
| 4,267,304 | 5/1981 | Feasey et al. | 528/193 |
| 4,286,075 | 8/1981 | Robeson et al. | 525/68 |
| 4,294,955 | 10/1981 | Harris, Jr. | 528/176 |
| 4,299,756 | 11/1981 | Calundann | 528/193 |
| 4,316,004 | 2/1982 | Imai et al. | 528/126 |
| 4,330,668 | 5/1982 | Hideo et al. | 528/271 |
| 4,333,907 | 6/1982 | Urasaki et al. | 264/290.2 |
| 4,342,862 | 8/1982 | Jackson, Jr. et al. | 528/193 |
| 4,447,593 | 5/1984 | Funakoshi et al. | 528/193 |
| 4,496,712 | 1/1985 | Irwin | 528/193 |

OTHER PUBLICATIONS

36 Plastics Manuf., vol. 88, 1978, p. 25, Ger. Offen. 2,721,786 to Calundann, Section 88: 74883d.

39-Textiles, vol. 88, 1978, p. 65, Ger. Offen. 2,721,787 to Calundann, Section 88: 90961h.

F. E. McFarlane, et al., "Liquid Crystal Polymers. II. Preparation and Properties of Polyesters Exhibiting Liquid Crystalline Melts", pp. 109-139.

F. E. McFarlane, et al., "Liquid Crystal Polymers. II. Preparation and Properties of Polyesters Exhibiting Liquid Crystalline Melts", Research Laboratories, Tennessee Eastman Company, Division of Eastman Kodak Company, Kingsport, Tennessee, pp. 109-115 and 118-139.

Griffin, et al., "Polymeric Liquid Crystals Structurally Related to 4-Alkoxyphenyl 4'-Alkoxybenzoates", Mol. Cryst. Liq. Cryst., vol. 49, (Letters), pp. 239-246, 1979.

Blumstein, et al., "Polymeric Thermotropic Liquid Crystals: Polymers with Mesogenic Elements and Flexible Spacers in the Main Chain", Mol. Cryst. Liq., vol. 49, (Letters), pp. 255-258.

Polymer Letters Edition, vol. 13, pp. 455-463, Roviello, et al., "Mesophasic Structures in Polymers A Preliminary Account on the Mesophases of Some Poly-Alkanoates of p,p'-di-hydroxy-$\alpha,\alpha'$-di-methyl Benzalazine", 1975 by John Wiley & Sons, Inc.

Jackson, Jr., et al., "Liquid Crystal Polymers. I. Preparation and Properties of p-Hydroxybenzoic Acid Copolyesters", Journal of Polymer Science: Polymer Chemistry Edition, vol. 14, pp. 2043-2058, 1976.

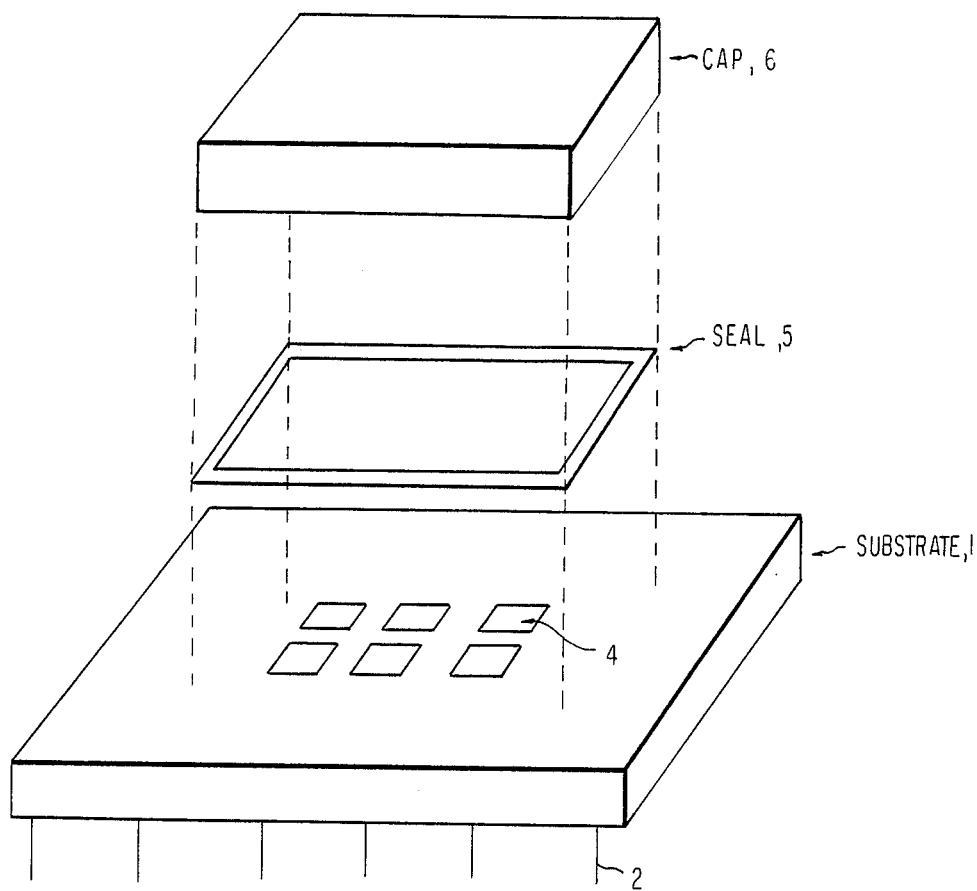

SEALANT FOR INTEGRATED CIRCUIT MODULES, POLYESTER SUITABLE THEREFOR AND PREPARATION OF POLYESTER

DESCRIPTION

1. Technical Field

The present invention is concerned with sealants for integrated circuit modules. The sealants are polyesters which yield liquid crystalline melts. The integrated circuit modules contain a substrate having electrically conductive pins protruding therefrom and having attached to the top side of the substrate at least one integrated circuit chip. The modules also include a cap or container which is hermetically sealed to the top side of the substrate, thereby covering the integrated circuit chip or chips thereon. The present invention is also concerned with certain new polyesters and the preparation thereof. In particular, the preferred polyesters of the present invention contain aromatic rings.

2. Background Art

During the preparation of integrated circuit modules, a variety of different types of compositions have been suggested for the purpose of sealing the top side of the substrate on which is attached at least one integrated circuit chip to a cap or container in order to seal and protect the electrically active portions of the module from corrosion due to environmental pollutants such as sulphur and water vapor. Examples of some suggested sealant compositions are liquid epoxy compositions, solid preform epoxy materials, solder glasses, and eutectic metals. However, none of these particular sealants are completely satisfactory, since none provide all of the desirable functions of a sealant to a completely satisfactory degree. In particular, it would be desirable to have a sealant composition which is capable of being reworked, resistant to stress-fatigue cracking, impermeable to water vapor, thermally stable, and stable in the presense of moisture. In addition, it would be desirable that all of these properties be achieved with a material which is relatively inexpensive to produce.

The presently commercially employed thermoset epoxy compositions do not provide adequate workability, are not sufficiently impermeable to ater, and are not sufficiently thermally and moisture stable. In fact, thermosetting polymers in general, are not completely satisfactory because of the relatively high thermal expansion coefficient of such and their inadequate workability. Thermoplastic polymers, on the other hand, are not completely satisfactory in view of low heat deflection or softening temperature of the polymers and also comparatively high thermal expansion coefficients. Various of the available solder glass compositions and eutectic metal compositions suffer from stress-fatigue cracking and are relatively expensive to produce.

In addition, the sealing composition must possess adequate flow characteristics for coating the substrate and/or cap, where desired.

SUMMARY OF THE INVENTION

The present invention is concerned with an integrated circuit module containing a substrate having electrically-conductive pins protruding therefrom and having attached to the top side thereof at least one integrated circuit chip. The integrated circuit chip is hermetically sealed by attaching a cap to the top side of the substrate. The cap is attached by providing a layer of the polyester between the cap and the substrate identified below.

The polyesters employed must exhibit liquid crystalline melts. The polyesters employed contain about 25 to about 100 mole percent of recurring Unit I and 0 to about 75 mole percent of recurring Unit II wherein:

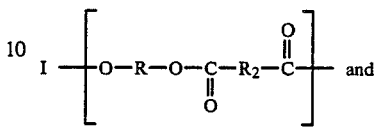 and

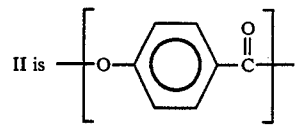

Each R and $R_2$, individually, is an arylene group, a cycloakylene group, alkylene group, or alkylidene. Mixtures of R and/or of $R_2$ groups can be employed, if desired.

The polyesters employed exhibit exceptionally low permeability towards moisture and form strong adhesive bonds to a variety of surfaces.

Moreover, since the polyesters employed can flow at elevated temperatues, they can be reworked upon the application of heat. In addition, the polyesters employed have high strengths and stiffness.

In addition, the present invention is concerned with hermetically sealing the top side of the substrate of an integrated circuit module. The process includes providing a substrate having electrically-conductive pins protruding therefrom; and having attached to the top side thereof at least one integrated circuit chip. A composition containing the polyester defined hereinabove is provided on selected portions of the top side of the substrate and a cap is adhered to the top side of the substrate by the polyester.

Moreover, the present invention is concerned with certain novel preferred polyesters having recurring Units III and II wherein

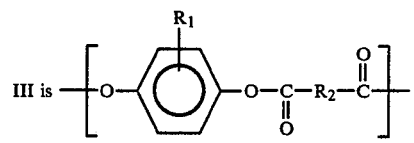

and

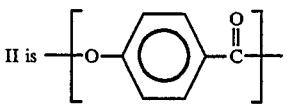

$R_1$ is an alkyl group, alkoxy group, aryl group, aralkyl group, alkaryl group, or halo group, or mixtures, and $R_2$ is phenylene or cyclohexylene or mixture thereof. The preferred polyesters of the present invention contain about 50 to about 90 mole percent of recurring Unit III and correspondingly, about 10 to about 50 mole percent of recurring Unit II. The polyester can contain mixtures of Unit III.

The present invention is also concerned with a process for preparing the above preferred polyester by admixing (A) 4-acetoxybenzoic acid, (B) 1,4-cyclohexanedicarboxylic acid, and/or terephthalic acid; and (C) a substituted 1,4-diacetoxybenzene. The diacetoxybenzene is substituted with an alkyl group, alkoxy group, aryl group, aralkyl group, alkaryl group, or halo group.

The above monomers are subjected to elevated temperatues of about 200° to about 350° C. to effect the polymerization. The polymerization is preferably carried out in the absence of a catalyst. However, if desired, catalysts can be employed. The polymerization is usually completed in about 4 to 8 hours.

BRIEF DESCRIPTION OF DRAWING

The FIGURE is schematic diagram in unassembled form of an integrated circuit module employing the polyester sealant in accordance with the present invention.

BEST AND VARIOUS MODES FOR CARRYING OUT INVENTION

According to the present invention, the polyesters employed contain generally about 25 to about 100 mole percent, more usually about 50 to about 100 mole percent, preferably about 50 to about 90 mole percent, and more preferably, about 60 to about 80 moles of recurring Unit I, and generally 0 to about 75 mole percent, more usually about 0 to about 50 mole percent, preferably about 10 to about 50 mole percent, and more preferably about 20 to about 40 moles of recurring Unit II. When recurring Unit II is present, it is usually present in amounts of at least about 10 mole percent.

Recurring Unit I is represented by the formula:

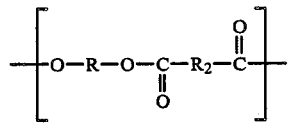

and recurring Unit II is represented by the formula:

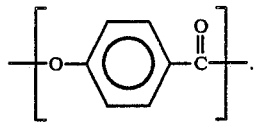

Each R and $R_2$ is individually arylene, alkylene, alkylidene, or cycloalkylene.

The arylene groups can be single ring such as phenylene, fused ring such as naphthalene, or multiring compounds wherein the rings are connected to each other by a direct bond such as biphenylene or connected through a bond such as an oxygen or sulfur atom such as diphenylene ether or diphenylene sulfone. The arylene groups can also be substituted or unsubstituted. The unsubstituted arylene portion of the arylene group contains 6 to 14 carbon atoms. Examples of substituents for the arylene groups are alkyl groups, aryl groups, alkaryl groups, aralkyl group, alkoxy groups, and halo groups.

The alkyl group preferably contains 1 to 4 carbon atoms and most preferably is methyl.

The aryl group preferably contains 6 to 14 carbon atoms such as phenyl and napthyl.

Examples of alkaryl groups are tolyl, xylyl, and cumyl.

An example of an aralkyl group is benzyl.

The alkoxy group preferably contains 1 to 4 carbon atoms and most preferably is methoxy.

Examples of halo groups are chloro, fluoro, and bromo.

Preferably, R is an arylene group, more preferably is a phenylene group, and most preferably, is a phenylene group substituted with one of the alkyl, aryl, alkaryl, aralkyl, alkoxy, or halo groups discussed hereinabove. The substituent is preferably chloro or phenyl and most preferably phenyl The preferred cycloalkylene group is cyclohexylene.

The alkylene and alkylidene groups usually contain 1 to 6 carbon atoms and preferably 1 to 4 carbon atoms and include methylene, ethylene, ethylidene, propylene, and isopropylidene.

Preferably, $R_2$ is phenylene or cyclohexylene.

Accordingly, the preferred polyesters employed i accordance with the present invention are represented by recurring Units III and II.

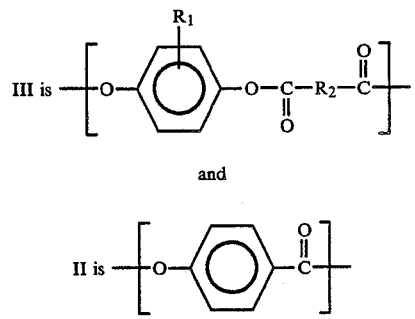

wherein $R_1$ is alkyl group, aryl group, alkaryl group, aralkyl group, alkoxy group, or halo group; and $R_2$ is phenylene or cyclohexylene.

The polyesters of the present invention are thermotropic liquid crystalline polymers. In addition, usually the polyesters of the present invention have a softening temperature of at least about 100° C. and a crystalline melting point of about 400° C. or lower. The molecular weight of the polymers is usually about 10,000 to about 100,000 and preferably, about 10,000 to about 50,000, and most preferably, about 10,000 to about 25,000.

The FIGURE illustrates a cross-section of a module of the present invention. Numeral 1 illustrates the substrate upon which pins 2 extend and protrude therefrom. The substrate employed is preferably a ceramic substrate. A ceramic is a product or material which can be manufactured by the action of heat of earthy raw materials. The preferred ceramic substrates include aluminum oxides, silicon oxides, and silicates such as aluminum silicate.

The pins 2 of the module can be any of the input/output pins well knwon in the art and need not be discussed herein in any great detail. Examples of suitable pins are gold-plated pins and tin-lead solder-coated pins. The substrate can include preformed holes through which the input-output pins can be inserted so as to protrude from one surface of the substrate for insertion into circuit boards or cards. In addition, the pins can be adhered to only the bottom side of the substrate by, for instance, brazing. In such cases, preformed holes are not necessary. In such instances, the conductivity to the integrated circuit chip mounted on the top side of the substrate is from the input/output pins through interspacial metallic interconnections provided in the substrate.

The integrated circuit chips, such as silicon or polycrystalline silicon chips, are represented by numeral 4 and are attached to sustrate 1 with solder. Numeral 5 represents the polyester sealant composition of the present invention. Numeral 6 represents the cap or can.

The cap or can 6 can be ceramic or metal such as aluminum. Such is employed to protect the top side and especially a chip from mechanical damage. With the polyester of the present invention, it is only necessary to coat the top surface or lip of the cap or can and adhere it to the top side of the substrate. The cap or can need not cover the entire substrate, but can be dimensioned so as to cover only the integrated circuit chips thereon. The cap should not be wider than the substrate in the configuration shown. Other integrated circuit module configurations can be employed such as that described in U.S. Pat. No. 4,233,620 to Darrow, et al. and assigned to International Business Machines Corporation with the exception that the sealing composition would be the polyester of the present invention in place of the epoxy-containing composition disclosed therein.

The polyester can be applied to the module in the form of a preformed solid material after which it is heated to about 200° to about 300° C. in order to soften the composition and cause adhesion between the cap and substrate. In addition, pressures of about 500 to about 1,000 psi are applied to assure good bonding.

The composition, if to be employed as a compressed preform, is subjected to about 500 to about 1,000 pounds per square inch, at temperatures of about 100° to about 200° C. to provide preforms of about 0.5 to about 3 mils thick, and preferbly about 2 to about 3 mils thick. The preforms are capable of being punched after compression, if desired.

The following non-limiting examples are presented to further illustrate the present invention.

EXAMPLE 1

About 51.33 parts by weight (0.2 mole) of 1,4-diacetoxy-2-phenyl benzene and about 31.55 parts by weight (0.2 mole) of terephathalic acid and about 17.12 parts by weight (0.1 mole) of 4-acetoxybenzoic acid are charged into a three-necked flask equipped with a mechanical stirrer, an inert gas inlet, and a distilling take-off head to allow for distillation of acetic acid. The solid monomer mixture is purged with nitrogen and heated to approximately 200° C. by means of a Wood's Alloy bath, at which point the monomer mixture forms a melt phase. The molten monomer mixture is now stirred virgorously while the temperature is slowly raised to 240° C. and acetic acid starts to distill. This process takes about 3 to 4 hours, and at this point most of the acetic acid has distilled off. At this point, the temperature is gradually raised over the next 2 hours to 300° C., while the pressure of the polymerization vessel is lowered slowly via a vacuum and nitrogen bleed arrangement. The polymerization mixture is maintained at 300° C. and a vacuum of less than or equal to 0.1 mm for another 2 hours at which point the polymerization is stopped. This yields the copolyester as an opaque plug with a marbled textured. Examination of the polymer on a polarizing, hot-stage microscope at 300° C. reveals a highly birefringent, viscous melt characteristic of the thermotropic, liquid crystalline nature of the material.

The polymer has a Tg of about 150° C. and has the following recurring Units:

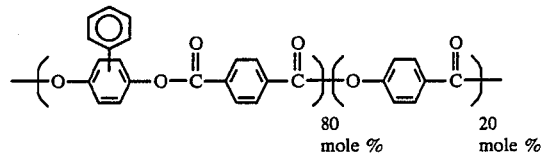

EXAMPLE 2

Example 1 is repeated, except that the reaction is from a mixture of about 35.66 parts by weight (0.15 mole) of 2-chloro 1,4 diacetoxybenzene, about 26.86 parts by weight (0.15 mole) of trans 1,4-cyclohexanedicarboxylic acid and about 37.47 parts by weight (0.2 mole) of 4-acetoxy benzoic acid. The polymer is a thermotropic, liquid crystalline polymer having a Tg of about 125° C. and has the following recurring Units:

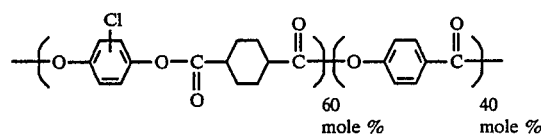

EXAMPLE 3

Example 1 is repeated, except that the reaction is from a mixture of about 50.75 parts by weight (0.2 mole) of 1,4 diacetoxy-2-phenyl benzene, about 32.33 parts by weight (0.2 mole) of trans 1,4-cyclohexanedicarboxylic acid and about 16.92 parts by weight (0.1 mole) of 4-acetoxy benzoic acid. The polymer is a thermotropic, liquid crystalline polymer having a Tg of about 110° C. and has the following recurring Units:

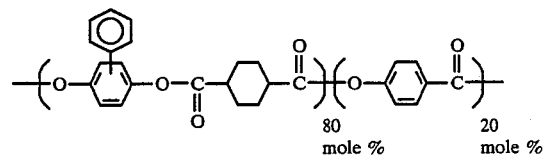

EXAMPLE 4

Example 1 is repeated, except that the reaction is from a mixture of about 39.59 parts by weight (0.15 mole) of 1,4-diacetoxy-2-phenyl benzene, about 25.22 parts by weight (0.15 mole) of trans 1,4-cyclohexanedicarboxylic acid and about 35.19 parts by weight (0.2 mole) of 4-acetoxy benzoic acid. The polymer is a thermotropic, liquid crystalline polymer having a Tg of about 115° C. and has the following recurring Units:

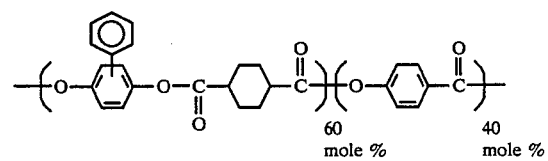

EXAMPLE 5

Permeability studies of these materials in the form of 0.5 inch by 1.5 inch films are performed on a sorption balance at 55° C. and 50% relative humidity. Results of this evaluation for the polymers of Examples 1 to 4 are compared in Table 1 with Scotchcast Epoxy, Polyimide, and a Fluorocarbon polymer which is evaluated by the same technique. The permeability, P, for the liquid crystalline polymers is 2 to 3 orders of magnitude better than the fluorocarbon material adn 4 orders of magnitude better than Scotchcast Epoxy.

TABLE 1

| Material | D | P |
|---|---|---|
| Copolymer Example 2 | $4.75 \times 10^{-12}$ | $13.0 \times 10^{-12}$ |
| Copolymer Example 3 | $31.1 \times 10^{-12}$ | $62.1 \times 10^{-12}$ |
| Copolymer Example 4 | $4.08 \times 10^{-12}$ | $9.90 \times 10^{-12}$ |
| Copolymer Example 1 | $273 \times 10^{-12}$ | $454 \times 10^{-12}$ |
| Scotchcast Epoxy | $10^{-7}$ | $10^{-7}$ |
| Polyimide | $10^{-9}$ | $10^{-8}$ |
| Fluorocarbon | $10^{-8}$ | $10^{-9}$ | wherein
D = Diffusivity for moisture (cm$^2$/sec)
P = Permeation for moisture (STD cc−cm/cm$^2$−sec−cm Hg)

What is claimed is:

1. An integrated circuit module including a substrate having electrically-conductive pins protruding therefrom having at least one integrated circuit chip attached to the top side of the substrate, a cap covering said at least one integrated circuit chip, wherein said cap is sealed to said substrate by a thermotropic liquid crystalline polyester having low permeability towards moisture and having about 25 to about 100 mole percent of recurring Units I, and 0 to about 75 mole percent of recurring Units II wherein

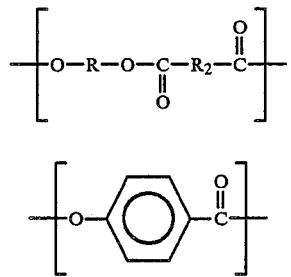

wherein each R and R$_2$, individually, is arylene; cycloalkylene; alkylene; alkylidene; or arylene substituted with a group selected from the group consisting of alkyl, aryl, alkaryl, aralkyl, alkoxy, or halo; or mixtures thereof.

2. The module of claim 1 wherein said polyester contains at least about 10 mole percent of recurring Unit II.

3. The module of claim 1 wherein said polyester contains about 50 to about 100 mole percent of recurring Unit I and 0 to about 50 mole percent of recurring Unit II.

4. The module of claim 1 wherein said polyester contains about 50 to about 90 mole percent of recurring Unit I and about 10 to about 50 mole percent of recurring Unit II.

5. The module of claim 1 wherein said polyester contains about 60 to about 80 mole percent of recurring Unit I and about 20 to about 40 mole percent of recurring Unit II.

6. The module of claim 1 wherein said arylene is substituted with a group selected from the group of alkyl, aryl, alkaryl, aralkyl, alkoxy, or halo; or is unsubstituted and wherein the unsubstituted moiety of the arylene group contains 6–14 carbon atoms; said alkylene and alkylidene contain 1–6 carbon atoms; and said cycloalkylene is cyclohexylene.

7. The module of claim 1 wherein R is arylene.

8. The module of claim 1 wherein said arylene is substituted with a member selected from the group of alkyl, alkoxy, aryl, alkaryl, aralkyl, halo, or mixtures thereof.

9. The module of claim 8 wherein said arylene is phenylene.

10. The module of claim 9 wherein said phenylene is substituted with a member selected from the group of CH$_3$, OCH$_3$, Cl, Fl, Br, phenyl, or mixtures thereof.

11. The module of claim 9 wherein said phenylene is substituted with phenyl.

12. The module of claim 11 wherein R$_2$ is phenylene.

13. The module of claim 11 wherein R$_2$ is cyclohexylene.

14. The module of claim 9 wherein said phenylene is substituted with chloro.

15. The module of claim 14 wherein R$_2$ is phenylene.

16. The module of claim 14 wherein R$_2$ is cyclohexylene.

17. The module of claim 1 wherein R$_2$ is phenylene or cyclohexylene or mixtures.

18. The module of claim 1 wherein R$_2$ is cyclohexylene.

19. The module of claim 5 wherein said arylene is phenylene.

20. The module of claim 19 wherein said phenylene is substituted with a member selected with a member selected from the group of CH$_3$, OCH$_3$, Cl, Fl, Br, phenyl, or mixtures thereof.

21. The module of claim 19 wherein said phenylene is substituted with phenyl.

22. The module of claim 21 wherein R$_2$ is phenylene.

23. The module of claim 21 wherein R$_2$ is cyclohexylene.

24. The module of claim 19 wherein said phenylene is substituted with chloro.

25. The module of claim 24 wherein R$_2$ is phenylene.

26. The module of claim 24 wherein R$_2$ is cyclohexylene.

27. The module of claim 1 wherein said polyester has a softening temperature of at least about 100° C., a crystalline melting point of about 400° C. or lower, and a molecular weight of about 10,000 to about 25,000.

* * * * *